United States Patent [19]

Allen et al.

[11] Patent Number: 5,045,431

[45] Date of Patent: Sep. 3, 1991

[54] DRY FILM, AQUEOUS PROCESSABLE PHOTORESIST COMPOSITIONS

[75] Inventors: Robert D. Allen; Gregory M. Wallraff, both of San Jose, Calif.; Logan L. Simpson, Austin, Tex.; William D. Hinsberg, III, Fremont, Calif.

[73] Assignee: International Business Machines Corporation, Armonk, N.Y.

[21] Appl. No.: 656,103

[22] Filed: Feb. 13, 1991

Related U.S. Application Data

[63] Continuation of Ser. No. 513,652, Apr. 24, 1990, abandoned.

[51] Int. Cl.$^5$ .............................................. G03C 1/76
[52] U.S. Cl. ................................... 430/270; 430/910; 522/15; 522/30
[58] Field of Search .................. 430/270, 910; 522/15, 522/30

[56] References Cited

U.S. PATENT DOCUMENTS

| | | | |
|---|---|---|---|
| 3,804,631 | 4/1974 | Faust | 430/910 |
| 3,833,384 | 9/1974 | Noonan et al. | 430/910 |
| 4,069,054 | 1/1978 | Smith . | |
| 4,247,623 | 1/1981 | Guild | 430/910 |
| 4,250,053 | 2/1981 | Smith . | |
| 4,273,857 | 6/1981 | Leberzammer et al. | 430/910 |
| 4,284,707 | 8/1981 | Nagasawa et al. | 430/910 |
| 4,345,020 | 8/1982 | Yoneda et al. | 430/270 |
| 4,361,640 | 11/1982 | Pine | 430/910 |
| 4,371,605 | 2/1983 | Renner . | |
| 4,491,628 | 1/1985 | Ito et al. . | |
| 4,710,446 | 12/1987 | Hoffmann et al. | 430/910 |

Primary Examiner—Jack P. Brammer
Attorney, Agent, or Firm—Charles D. Gunter, Jr.

[57] ABSTRACT

A new polymer family is shown for use in high speed photoresists. A dry film photoresist includes a polymer binder prepared from t-butyl methacrylate/methylmethacrylate/acrylic acid/ethyl acrylate and a suitable initiator.

4 Claims, No Drawings

DRY FILM, AQUEOUS PROCESSABLE PHOTORESIST COMPOSITIONS

This application is a continuation of application Ser. No. 513,652, filed April 24, 1990, now abandoned.

CROSS REFERENCE TO RELATED APPLICATIONS

This application is related to the copending application of Robert D. Allen, Gregory M. Wallraff, Logan L. Simpson and William D. Hinsberg, entitled "LIQUID APPLY, AQUEOUS PROCESSABLE PHOTORESIST COMPOSITIONS", filed concurrently herewith.

1. Technical Field

The present invention relates generally to dry film, aqueous processable photoresist compositions useful in a variety of lithographic applications and specifically to a family of such photoresist compositions which are based upon acrylic co, ter, tetra etc. polymers having acid-labile side groups which react with photoacid generators in chemical amplification reactions to produce positive photoresists having higher resolution than existing systems.

2. Description of the Related Art

The need for higher resolution is a continuing driving force in the development of new lithographic materials. The "RISTON" family of dry film photoresists are widely utilized in circuit board fabrication. These materials are based on photoinitiated free-radical polymerization of multifunctional monomers, leading to insolubilization of the exposed areas via cross-linking. Such resists exhibit high sensitivity due to the nature of the polymerization wherein many covalent bonds are produced for each radical generated. However, the tendency toward swelling during development, the requirement for an oxygen impermeable cover sheet during the exposure step, and resolution limitations are all drawbacks which are intrinsic to this resist chemistry.

The design of chemically amplified resist systems based on acid-catalyzed chain reactions (e.g., polymerization, depolymerization, side chain cleavage, etc.) has been recognized as a viable route to high sensitivity resist systems in microlithography. Such systems are described in, e.g., *Polymers in Electronics,* Davidson T. Ed., ACS Symposium Series 242, American Chemical Society, Washington, D.C., 1984, p.11, H. Ito, C. G. Willson. These systems offer the high sensitivity attendant with chemical amplification but avoid the drawbacks of free-radical based systems.

The present invention has as its object to provide a new family of photoresist compositions designed to operate via acid-catalyzed chemical amplification as a route to high sensitivity for circuitization applications such as printed circuit board manufacture, etc. The materials of the invention offer improved resolution, the capability of imaging at virtually any desired wavelength, easily controllable thermal properties for dry film applications, and aqueous processibility.

SUMMARY OF THE INVENTION

The photosensitive resist compositions of the invention comprise:

(A) a film forming polymer binder, the polymer chain of said polymer binder comprising the following polymerizable units:

a first monomer which contributes acid sensitive groups pendant on the polymer backbone, a second monomer which is selected from the group consisting of alkyl methacrylates, alkyl acrylates and combinations thereof, a third monomer selected from the group consisting of carboxylic acids of acrylates and carboxylic acids of methacrylates, and (B) an initiator which generates acid upon exposure to radiation.

The dry film photosensitive resist compositions of the invention are adapted for hot roll lamination to a substrate at a selected lamination temperature and also operate by the mechanism of acid catalyzed chemistry. For dry film application, the first monomer is preferably selected from the group consisting of tertiary butyl methacrylate and tertiary butyl acrylate. The second monomer is most preferably methyl methacrylate, ethyl acrylate, and combinations thereof, and the third monomer is most preferably acrylic acid. Preferably, the ethyl acrylate is present in an amount effective to lower the glass transition temperature of the resist composition in the range from about 30 to 50 degrees below the selected hot roll lamination temperature.

DETAILED DESCRIPTION OF THE PREFERRED EMBODIMENT

The photoresist compositions of the invention include a film forming polymer binder. The binder is an acrylic polymer which includes acid-labile side groups which react with a selected photoacid generator in a chemical amplification reaction to produce positive photoresists.

The acrylic polymer which makes up the film forming binder includes a first monomer which contributes the acid sensitive groups pendant on the polymer backbone. The preferred acid labile pendant groups are t-butyl esters of carboxylic acids and t-butyl carbonates of phenols but, it is understood that a wide range of acid labile groups are operative in the invention. For instance, additional acid sensitive groups are listed in U.S. Pat. No. 4,491,628, "Positive- And Negative-Working Resist Compositions With Acid Generating Photoinitiator and Polymer With Acid-Labile Groups Pendant From Polymer Backbone" H. Ito, C. G. Willson, and J. M. J. Frechet, the disclosure of which is incorporated herein by reference. Preferred acid sensitive groups useful in the practice of the present invention include the t-butyl esters of acrylates and methacrylates.

The first monomer is preferably present in the polymer binder in the range from about 10 to 50% by weight based on the sum of all polymerizable units present.

The second class of monomer used to produce the polymeric binder is selected from the group consisting of alkyl methacrylates, alkyl acrylates and combinations thereof, e.g. methyl methacrylate (MMA) or ethyl methacrylate, ethyl acrylate (EA) or butyl acrylate. The most preferred second monomers are methyl methacrylate and/or ethyl acrylate. The choice of monomer or monomers which make up the second monomer class is dependent, at least in part, upon the glass transition temperature (Tg) requirement of the polymer binder which differs dependent upon whether the composition will be liquid or dry-film applied. The second monomer class is present in the polymer binder in the range of 30–70% by weight based on the sum of all polymerizable units present.

The third monomer is preferably selected from the group consisting of carboxylic acids of acrylates and carboxylic acids of methacrylates, e.g., acrylic acid and methacrylic acid. The choice of third monomer is also influenced by the glass transition temperature (Tg) requirements of the polymer binder, as will be explained. The third monomer is preferably present in the polymer in the range from about 5 to 30% by weight, based on the sum of all polymerized units present.

The preparation of polymers falling within the above described classes will be familiar to those skilled in the art, since they are readily prepared using known techniques. For instance, methacrylate and acrylate homo-,co-,ter-, tetra-, etc., polymers are synthesized by free radical solution polymerization. The choice of polymerization solvent is governed by factors such as solubility of the monomers, the nature of the initiators and formed polymer, boiling point, cost, etc. A variety of azo and peroxide initiators can be used to initiate the polymerization. In a typical synthesis, a reactor is charged with solvent (THF, MEK, etc.) and the desired monomers such that the formed polymer, assuming 100% conversion, attains a final concentration of 10 to 50% (wt/wt). The initiator is then charged (typically AIBN or BPO), at levels from 0.05% to 1.0% (vs. monomer), depending on the desired molecular weight. The system is sparged with nitrogen to remove oxygen. The polymerization is typically run at 60 to 80 degrees centigrade for 10 to 24 hours. The polymer is isolated by precipitation into a nonsolvent (hydrocarbon or water), and collected and dried at elevated temperatures under vacuum.

The initiator or photoacid generator used in the photosensitive resist compositions of the invention produce strong acids upon exposure to radiation. They are described in the literature and include, depending upon the exposure technology, aryldiazonium, diaryliodonium and triarylsulfonium metal halides. Other photoacid generators are described, e.g., in U.S. Pat. No. 4,250,053, "Sensitized Aromatic Iodonium or Aromatic Sulfonium Salt Photoinitiator Systems", issued Feb. 10, 1981, to George H. Smith, the disclosure of which is incorporated herein by reference. Nonionic photoacid generators are also well known, and are described in the art. The photoacid generator is preferably present in the polymer binder in the range from about 1 to 20 w/w% to polymer.

The photoresist compositions of the invention can also contain a sensitizer capable of sensitizing the photoacid generator to longer wavelengths ranging from mid UV to visible light. Depending upon the intended application, such sensitizers include polycyclic aromatics such as pyrene and perylene. The sensitization of the photoacid generators is well known and has been described in U.S. Pat. No. 4,250,053, cited earlier and in C. Rehner, U.S. Pat. No. 4,371,605. A preferred sensitizer useful in sensitizing the photoresist compositions of the invention for visible light or laser direct imageable photoresists is described in the copending application of Robert D. Allen, William D. Hinsberg III, Logan L. Simpson, Robert Twieg, Gregory M. Wallraff and Carlton G. Willson entitled "Photoacid Generating Composition and Sensitizer Therefor", filed Dec. 27, 1989, Ser. No. 07/458,048, the disclosure of which is incorporated herein by reference. The invention is not limited to the use of a particular class of sensitizer or photoacid generator, however.

The novel film forming polymer binder and selected photoacid generator provide a photoresist composition which is well suited for use in imaging processes utilizing the imaging mechanism known as "chemical amplification." The methacrylate terpolymers used as the acid-labile binder provide tough, film-forming characteristics, while the "chemical amplification" mechanism (involving onium salt photolysis, acid generation, and side-group deprotection) is unique in its ability to afford a combination of high photospeed, high contrast, and oxygen insensitivity. Chemical amplification is described, e.g., in U.S. Pat. No. 4,491,628, "Positive- And Negative-Working Resist Compositions With Acid Generating Photoinitiator and Polymer With Acid-Labile Groups Pendant From Polymer Backbone" H. Ito, C. G. Willson, and J. M. J. Frechet, previously cited and incorporated herein by reference.

The polymer materials selected from the first, second and third monomer classes described above, and which are used in the resists of the invention, have properties which make them uniquely suited as photoresists. The t-butyl ester monomer contributes the acid sensitive groups which form the basis of the acid catalyzed deprotection mechanism. The acrylate/methacrylate monomer increases the toughness of the film, while the acrylic acid/methacrylic acid monomer helps to control the development rate of the exposed resist.

Thus, the above stated monomers each fill a vital role in the makeup of the resin system. The t-butyl ester monomer (e.g. t-butyl methacrylate) (TBMA) imparts acid sensitivity to the polymer, i.e., photogenerated acid can react with side groups in the polymer chain to render them soluble in an aqueous base developer. However, a simple poly(t-butyl methacrylate) homopolymer is inadequate for circuitization applications, due to its cost, poor mechanical properties, incompatibility toward a variety of common acid generators. A much more desirable resin is produced through copolymerization with methyl methylacrylate and/or ethyl acrylate. Copolymerization with this "non-active" monomer leads to dramatic increase in mechanical properties and cost performance. In addition, the increase in solubility of most common photoinitiators in the polymer film leads to an unanticipated increase in photospeed. These copolymers are excellent imaging materials when formulated with photo-acid producing compounds. Their only limitation is the lack of processibility in fully aqueous developers (e.g. aqueous sodium carbonate). The addition of a third monomer is critical in achieving the desired developability. Methacrylic acid and/or acrylic acid is terpolymerized with the above two monomers. A compositional window exists whereby fairly rapid yet practical development rates in exposed areas exists, but the unexposed film exhibits no developer attack. It was anticipated that this addition of acidic monomer would lead to a loss of contrast, but within the boundaries of this relatively wide window, contrast is excellent. These terpolymers are synergistic materials which combine aqueous developability, good mechanical properties, low cost, excellent adhesion, and excellent contrast to lead to outstanding resolution capabilities.

These terpolymers exhibit excellent development characteristics, similar to those commonly found in high resolution novolak-based photoresists. An initial induction period, followed by a second stage of rapid development is common to both classes of materials, leading to high contrast, and thus, resolution.

However, in addition to the resist requirements of photospeed, contrast, resolution, aqueous developability and oxygen insensitivity, in the design of a dry film material consideration must also be given to the thermal properties of the resist. Hot-roll lamination temperatures of 100° C. to 120° C. are desirable for resist applications. Experience dictates that glass transition temperatures (Tg) of the resist composition should be from about 30 to 50 degrees below the desired lamination temperature. The materials described above form excellent films when coated on Mylar, are tough and flexible, not prone to cracking, or physical delamination. However, due to the intrinsically high Tg of the methacrylic acid-containing materials, useful imaging materials have high glass transition temperatures, and correspondingly excessive transfer (lamination) temperatures, at or near the decomposition temperature of the resist.

Thus, to lower the Tg of the resin without degrading the aqueous development characteristics, it is preferred to substitute acrylic monomers for methacrylic monomers in the dry film material, thereby lowering the glass transition temperature of the resist composition below about 90° C. For example, simply replacing methacrylic acid (MAA) with acrylic acid (AA) lowers the Tg of a typical resist from 30 to 40 degrees while keeping the desirable imaging characteristics.

The following example is intended to be illustrative of the invention:

EXAMPLE

The photosensitive materials which resulted from the tetrapolymerization of EA with MMA, TBMA, and AA are well adapted for use as dry film photoresists. For example, a dry-film resist containing an EA-MMA-TBMA-AA tetrapolymer binder of composition 0.75/0.75/1.0/0.035 (weight ratio) showed excellent imaging characteristics, formed tough films, had a Tg of 83° C., and transferred to copper at 120° C. The dry film tetrapolymer exhibits tremendous versatility, as demonstrated by spinning the formulated material (from solution with 10% diphenyl iodonium hexafluoroantimonate) onto Mylar to give a 1.0 μm film. The dry film resist was then transferred onto a silicon wafer (100° C., thumb pressure) and imagewise exposed at 254 nm. Resolution patterns of 2 μm spaces were opened after development. This experiment was successfully repeated with e-beam exposure, this time opening 1.0 μm gaps in a 1.0 μm film at a dose of 5.0 μC/cm$^2$.

An invention has been provided with several advantages. The materials of the invention are tough, film-forming, capable of acid-catalyzed deprotection chemistry, high resolution imaging and are developable in sodium carbonate/water. Specially tailored properties can be "tuned" to an unanticipated extent by adjusting both the monomer ratios and molecular weight. Thus, TBMA provides the acid sensitivity which is the basis of a chemically amplified resist. The non-active monomer (MMA) gives improved mechanical properties and increases the solubility of the photoacid generator in the terpolymer binder without degrading the photospeed. A third monomer (MAA), acts to alter the development rate of the exposed resist, without affecting the contrast, i.e., the unexposed resist remains inert to the developer. The ethyl acrylate lowers the transition glass temperature of the resist composition, making it well suited for hot roll lamination as a dry film.

While the invention has been particularly shown and described with reference to a preferred embodiment, it will be understood by those skilled in the art that various changes in form and detail may be made therein without departing from the spirit and scope of the invention.

We claim:

1. A photosensitive resist composition which is processable in aqueous media and which forms a laminatable layer when applied as a film from a liquid solution of an organic solvent, the laminatable layer being adapted for lamination onto a target substrate at a lamination temperature in the range from about 100°–120° C., the resist composition consisting essentially of:
   (A) from about 99 to 80% by weight of a film forming reactive polymer containing polymer groups which react upon acid catalysis, the polymer chain of the reactive polymer comprising the following polymerizable units:
      from about 10 to 50% by weight, based on the weight of the film forming reactive polymer, of a first monomer capable of undergoing an acid catalyzed conversion to render the product of the conversion soluble in an aqueous base developer, the first monomer being selected from the group consisting of tertiary butyl acrylate and tertiary butyl methacrylate,
      from about 30 to 70% by weight, based on the weight of the film forming reactive polymer, of a second monomer class which does not undergo an acid catalyzed reaction, the second monomer class comprising a mixture of ethyl acrylate and another monomeric component selected from the group consisting of methyl methacrylate, methyl acrylate and combinations thereof,
      from about 5 to 20% by weight, based on the weight of the film forming reactive polymer, of a third monomer selected from the group consisting of acrylic acid and methacrylic acid, and
   (B) from about 1 to 20% by weight of an initiator which generates acid upon exposure to radiation, thereby producing acid catalysis of the film forming reactive polymer.

2. A photosensitive resist composition which is processable in aqueous media and which forms a laminatable layer when applied as a film from a liquid solution of an organic solvent, the laminatable layer being adapted for lamination onto a target substrate at a lamination temperature in the range from about 100°–120° C., the resist composition consisting essentially of:
   (A) from about 99 to 80% by weight of a film forming reactive polymer containing polymer groups which react upon acid catalysis in a chemical amplification reaction, the polymer chain of the reactive polymer comprising the following polymerizable units:
      from about 10 to 50% by weight, based on the weight of the film forming reactive polymer, of a first monomer capable of undergoing an acid catalyzed conversion to render the product of the conversion soluble in an aqueous base developer, the first monomer being selected from the group consisting of tertiary butyl acrylate and tertiary butyl methacrylate,
      from about 30 to 70% by weight, based on the weight of the film forming reactive polymer, of a second monomer class which does not undergo an acid catalyzed reaction, the second monomer class comprising a mixture of ethyl acrylate and another monomeric component selected from the group consisting of ethyl acrylate and methyl methacrylate, from about 5 to 20% by weight, based on the weight of the film forming reactive polymer, of a third monomer which comprises acrylic acid, and (B) from about 1 to 20% by weight of an initiator which generates acid upon exposure to radiation, thereby producing acid catalysis of the film forming reactive polymer.

3. The photosensitive resist composition of claim 2, wherein the film forming, reactive polymer is a tetrapolymer of ethyl acrylate/methyl methacrylate/tertiary butyl acrylate/acrylic acid in a relative weight ratio of approximately 0.75/0.75/1.0/0.035.

4. The photosensitive resist composition of claim 2, wherein the initiator is selected from the group consisting of aryldiazonium, diaryliodonium and triarylsulfonium metal halides.

* * * * *